SEMI-CONDUCTOR DEVICES

Filed Aug. 29, 1957

Inventor
R·D·Sutherland -
W·A·Catchpole
By John M. Calimafde
Attorney

United States Patent Office 2,939,205
Patented June 7, 1960

2,939,205

SEMI-CONDUCTOR DEVICES

Ronald Denis Sutherland and William Alan Catchpole, London, England, assignors to International Standard Electric Corporation, New York, N.Y.

Filed Aug. 29, 1957, Ser. No. 681,045

Claims priority, application Great Britain Sept. 5, 1956

2 Claims. (Cl. 29—25.3)

This invention relates to semiconductor devices and more particularly to method of manufacturing such devices.

Semiconductor devices such as transistors are known comprising, for instance, a so called crystal of germanium to which a base electrode, a collector electrode and an emitter electrode are attached. The collector and emitter electrodes each make asymmetric or rectifying connection with the crystal over a restricted area thereof while the base electrode preferably makes a relatively low ohmic resistance connection, generally over a considerably greater area of the crystal. The crystal comprises semiconductor material of a predetermined type of conductivity to which the base electrode is attached while two collector and emitter electrodes are attached to areas which have, or are converted to, conductivity of the opposite type, rectifying actions being obtained at the junctions between the two types of conductivity of the crystal. One feature of the present invention consists in a method of making a semiconductor device having a base electrode, a collector electrode and an emitter electrode attached to a body of semiconductor material which comprises the steps of placing a bold coated metal body in contact with the surface of the semiconductor body and causing said gold coating to flow and form a union with said surface by the passage of electric current through said metal body from one part thereof to another.

When the semiconductor material has P-type conductivity it has been found satisfactory to use gold plated molybdenum for the metal body but when the semiconductor has N-type conductivity it is preferred to flash plate the gold plating with a metal forming a donor impurity to the semiconductor material.

Another feature of the invention consists in a method of making a semiconductor device having a base electrode, a collector electrode and an emitter electrode attached to a body of semiconductor material which comprises the steps of locating in a jig on a first surface of a body of semiconductor material of predetermined or first type conductivity a first pellet of opposite type conductivity material to form the emitter (collector) electrode, heating the assembly in the jig in an inert atmosphere to a first temperature at which the first pellet material wets said first surface of the semiconductor material, locating in a jig on a second surface of the body of semi-conductor material a second pellet of opposite type conductivity material to form the collector (emitter) electrode, heating the assembly in the jig in an inert atmosphere to a second temperature at which the second pellet material wets said second surface of the semiconductor material, heating to a third temperature in an inert atmosphere at which alloying of both said pellets with the semiconductor material occurs to a predetermined depth, maintaining the assembly at said temperature for a predetermined time interval, and cooling the assembly at a rate which allows the dissolved semiconductor material in solution in the pellets to crystallise uniformly on to the main body of the semiconductor material.

As will be later described, the emitter and collector electrodes are preferably on opposite sides of the semiconductor material and at least those portions of the jig which come into contact with any part of the assembly are constructed of pure graphite which, it has been found, does not introduce any impurities into any of the materials used. It has also been found that oxygen free hydrogen forms a suitable inert atmosphere in which to carry out the heating operations.

A further feature of the invention consists in a method of making a semiconductor device having a base electrode, a collector electrode and an emitter electrode attached to a body of semiconductor material which comprises the steps of placing a lead in contact with one of the electrodes, passing current between the lead and the material until the electrode is melted, inserting the lead into the electrode, applying flux to the junction of the lead and the electrode and again passing current between the lead and the material until the electrode remelts and wets the lead.

As will be appreciated, either direct or alternating current may be used and, where it is desired to attach leads to both the emitter and the collector electrode they may be attached simultaneously and the current, in the form of alternating current, may be applied between the two leads to be attached.

It has been found that by suitably dimensioning the semiconductor material and the electrodes, devices may be made which are particularly suitable for high speed switching, that is to say, which respond rapidly to pulses of short duration.

The manufacture of semiconductor devices embodying the invention will now be described with reference to the accompanying drawings in which.

Figures 1, 2, 3, 4, 5, 6, 7:
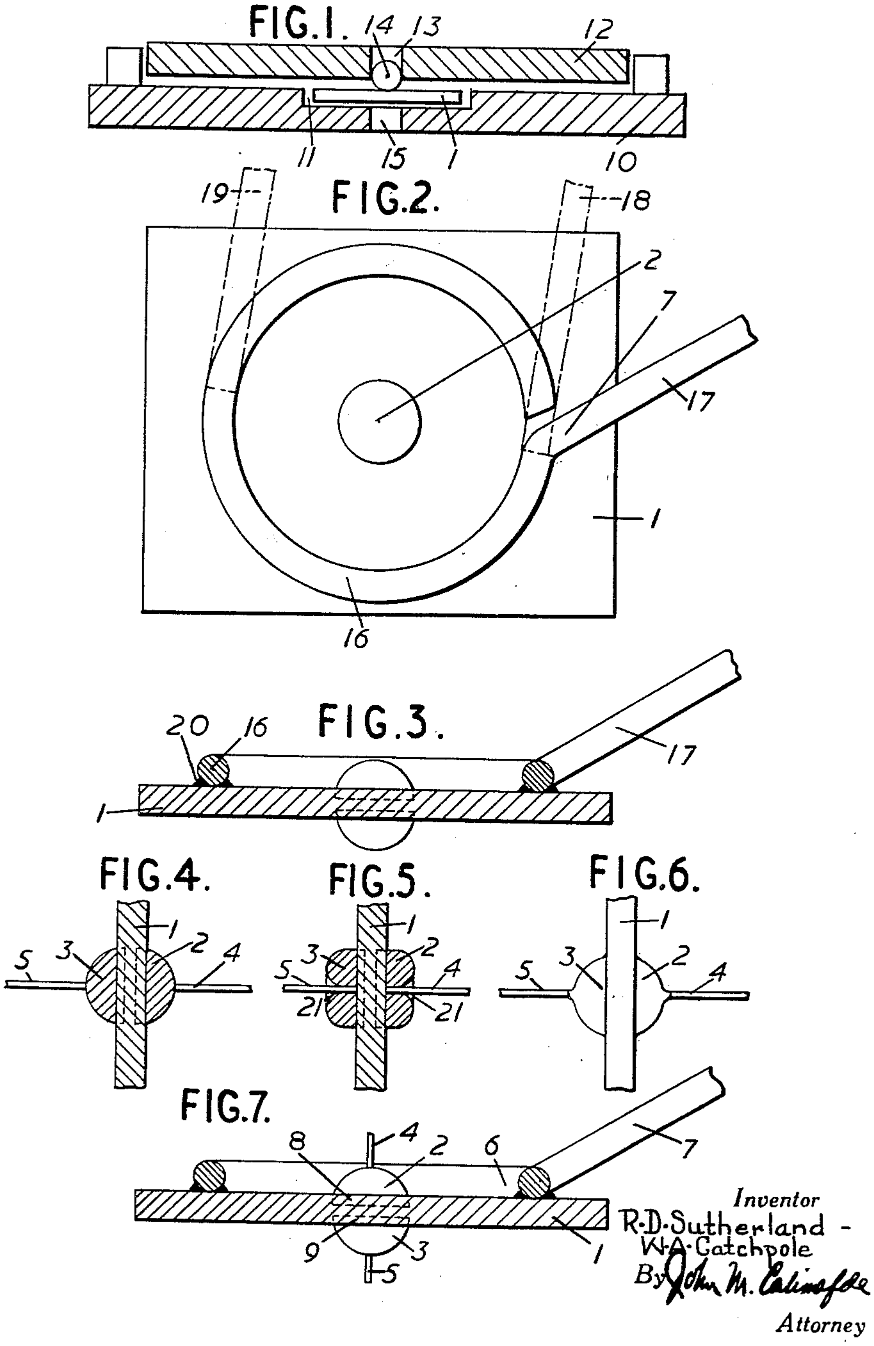
Fig. 1 is a sectional view of a jig for locating the emitter and collector electrodes.
Fig. 2 is a plan view of the arrangement for attaching the base electrodes.
Fig. 3 is a sectional side view of a device after attachment of the electrodes.
Fig. 4 is a sectional side view of part of a device showing the electrode leads in position.
Fig. 5 shows the leads inserted into the electrodes.
Fig. 6 shows the leads and electrodes at a later stage.
Fig. 7 is a sectional view of a completed germanium transistor.

Referring first to Fig. 7, a germanium transistor comprises a slice 1 of germanium of predetermined conductivity, say 1 ohm-cm. N-type, of suitable dimensions which may be one tenth of an inch square by two thousandths of an inch thick. To this slice is attached an emitter electrode 2 and a collector electrode 3, which may be pellets of indium, having platinum leads 4, 5. The base electrode 6 surrounds one of the other electrodes, in this case the emitter electrode 2 and consists of molybdenum wire about four thousandths of an inch in diameter having a lead out end 7. The attachment of the indium pellets 2, 3 to the slice 1 cause zones of P-type conductivity germanium to be formed respectively at 8, 9.

As will be appreciated, when the slice 1 comprises P type germanium the emitter and collector electrodes will have to comprise a donor impurity such as antimony or a lead-antimony alloy.

These zones 8 and 9 consist of germanium which has alloyed with or gone into solution with the electrode material at an elevated temperature and has crystallised out again upon cooling. For a good transistor it is necessary that the two zones 8, 9 shall be very close together and parallel to one another and also that the crystallisation of the two zones shall be uniform. Investigation has shown that when a sphere, of say indium, is placed upon the surface of a germanium crystal which has been cut in the 1—1—1 plane in any known manner and is heated, the indium first of all collapses to form a hemisphere and retains substantially this shape, possibly due to surface tension, even when heated to considerably beyond its melting point. Furthermore, at some temperature above its melting point, say 350° C., the melting point of indium being 155° C., the indium "wets" the surface of the germanium without penetrating the germanium to any measurable extent. As the temperature is raised penetration occurs to a depth dependent upon the maximum temperature reached and practically independent of the time that temperature is maintained. Thus at a temperature of 550° C., indium penetrates germanium to a depth of about 0.6 thousandths of an inch. With regard to the crystallising out of the germanium it has been found that the slower the rate of cooling the greater the uniformity of crystallisation.

Turning now to the method of applying the emitter and collector electrodes, there is shown in Fig. 1 a jig. 10, having a central recess 11 into which the slice 1 fits snugly. Located on the top of the jig 10 is a plate 12 having a central hole 13 large enough to locate a pellet 14 of indium. Both the jig 10 and the plate 12 or at least those parts thereof which come into contact with the slice 1 and the pellet 14 should be made of a material such as pure graphite which will not impart impurities to the slice or pellet and will not be affected by the atmosphere in which it is to be heated. By suitably heating the assembly the indium pellet is caused to melt and form a dome-shaped electrode upon the surface of the slice. A suitable heat cycle for such an operation is to bring the assembly up to temperature of between 340° C. and 380° C. (nominally 350° C.) in 15 minutes in say an atmosphere of hydrogen, retain there at for 10 minutes and then cool to room temperature. The slice is now turned over so that the dome of indium locates in the hole 15 in the jig. 10. A second pellet is inserted into the hole 13 and the assembly is again raised to between 340° C. and 380° C. (nominally 350° C.) in hydrogen in 15 minutes and held thereat for 10 minutes. The temperature is now raised in 15 minutes to between 475° C. and 590° C. (nominally 550° C.) in hydrogen and held for 10 minutes after which the assembly is cooled at a rate of 20° C. per minute down to at least 350° C. and then down to room temperature. The heat cycle involving 550° C. causes the indium to enter the germanium and form P-type conductivity zones such as 8 and 9, Fig. 7.

In order that the indium shall enter uniformly and thus present two flat uniformly spaced zones 8, 9, the surfaces of the slice 1 should be parallel and in the 1—1—1 plane of the crystal structure.

Preferably the indium pellets are cleaned, just prior to this treatment by dipping in concentrated nitric acid and thereafter washed and dried.

When the slice 1 comprises P-type conductivity germanium and antimony or lead-antimony alloy pellets are used, the temperatures used should be 630° C. to 690° C. (nominal 650° C.) instead of 340° C. to 380° C. and 725° C. to 850° C. (nominal 750° C.) instead of 475° C. to 590° C.

In order to provide a base electrode 7, one end of a piece of molybdenum wire, about four thousandths of an inch in diameter and which has been gold plated to a thickness of half a thousandths of an inch and flash plated with antimony, is curled into a circle (16, Fig. 2) of about forty thousandths of an inch diameter and placed around one of the indium electrodes such as 2, Fig. 2. The stem 17 of the wire is kept clear of the slice 1 as seen more clearly in Fig. 3. Two pencils or probes, shown dotted in Fig. 2 as 18 and 19 are placed on the ring 16 diametrically opposite one another with one of the probes at the junction between the end of the wire and the stem 17. The probes 18, 19 serve to keep the ring in position and to pass a D.C. or alternating current around the ring from one probe to the other of such value and duration that the gold coating on the ring begins to flow, the gold thereby welding the ring to the slice as seen at 20 in Fig. 3. Undue heating of the semiconductor should be avoided.

Leads 4, 5 are now applied to the indium electrodes either separately or together. It has been found that if a lead, of say platinum wire, is placed in contact with one of the indium electrodes as in Fig. 4, and a current is passed therebetween, the electrode can be made to melt and the lead be pushed into and embedded in the indium to any desired depth, as in Fig. 5, without disturbing the opposite type conductivity zone underneath. Thereafter the indium electrode material may be caused to remelt and wet the lead and tend to flow up it, as in Fig. 6, thus making good electrical contact therewith, by the further passage of current, a suitable flux having been applied to the junction 21 Fig. 5, between the electrode and the lead. In this manner the introduction of impurities into the electrodes is avoided as also is the use of a base metal solder. It has been found practicable to attach both the leads 4 and 5 at the same time, the currents used being alternating current applied between the leads 4 and 5.

The completed transistor which now appears as in Fig. 7 may be washed and given an overall etch in known manner to clean it up, the exposed parts being only semiconductor, indium and platinum or other noble metal.

As already stated, when the slice 1 comprises P-type conductivity germanium, a donor instead of an acceptor material is used for the emitter and collector electrodes, e.g. antimony or lead-antimony alloy in place of the indium. Furthermore, the flash plating of antimony on the gold plated molybdenum wire, the purpose of which was to ensure that no P-type conductivity zone was formed at the base electrode, is not now required. As will be well understood the slice 1 may be prepared by etching in known manner from a thicker slice and the characteristics of the transistor will be affected by the purity and conductivity of the germanium used and by the closeness with which the zones 8 and 9 are made to approach one another during the heat cycles, while remaining planar.

It is to be understood that the germanium may be replaced by other suitable semiconductor or semiconductors. For example silicon or intermetallic compounds may be used for the slice 1 together with appropriate donor and acceptor materials for the electrodes.

While the principles of the invention have been described above in connection with specific embodiments, and particular modifications thereof, it is to be clearly understood that this description is made only by way of example and not as a limitation on the scope of the invention.

What we claim is:

1. A method of making a transistor which comprises the steps of locating in a graphite jig a first pellet of indium on a first surface of a crystal of N-type germanium cut in the 1.1.1. plane, raising the temperature of the assembly in the jig in an atmosphere of oxygen free hydrogen at a steady rate in a time interval of approximately 15 minutes to a first elevated temperature between 340° C. and 380° C., maintaining said first elevated temperature for a period of approximately 10 minutes, cooling to room temperature, locating in the jig a second pellet of indium on a second surface of the crystal opposite said first surface, said first and second pellets being substantially opposite one another, again raising the temperature of the assembly in the jig in said atmosphere at said steady rate to said first elevated temperature, maintaining said first elevated temperature for a period of approximately 10 minutes, further raising the assembly in the jig in said atmosphere at a steady rate in a time interval of approximately 15 minutes to a second elevated temperature between 475° C. and 590° C., maintaining said second elevated temperature for a period of approximately 10 minutes, cooling the assembly in said atmosphere at a rate of approximately 20° C. per minute from said second elevated temperature down to at least said first elevated temperature, further cooling said assembly down to room temperature, placing a ring of gold-plated and antimony flash-plated molybdenum wire on one of said surfaces of the crystal around the indium pellet thereon, passing alternating current around two halves of said ring in parallel until said gold-plating flows and forms a union with said one surface of the crystal, placing the ends of two platinum wires in contact respectively with said two indium pellets, melting said indium pellets by the passage of alternating current between said wires, inserting the wires respectively into the melted pellets, applying a suitable flux at the junctions between the wires and the pellets and remelting said indium pellets by the passage of alternating current between the wires until the wires are wetted by the indium of the pellets.

2. A method of making a transistor which comprises the steps of locating in a graphite jig a first pellet of antimony on a first surface of a crystal of P-type germanium cut in the 1.1.1. plane, raising the temperature of the assembly in the jig in an atmosphere of oxygen free hydrogen at a steady rate in a time interval of approximately 15 minutes to a first elevated temperature between 630° C. and 900° C., maintaining said first elevated temperature for a period of approximately 10 minutes, cooling to room temperature, locating in the jig a second pellet of antimony on a second surface of the crystal opposite said first surface, said first and second pellets being substantially opposite one another, again raising the temperature of the assembly in the jig in said atmosphere at said steady rate to said first elevated temperature, maintaining said first elevated temperature for a period of approximately 10 minutes, further raising the assembly in the jig in said atmosphere at a steady rate in a time interval of approximately 15 minutes to a second elevated temperature between 725° C. and 800° C., maintaining said second elevated temperature for a period of approximately 10 minutes, cooling the assembly in said atmosphere at a rate of approximately 20° C. per minute from said second elevated temperature down to at least said first elevated temperature, further cooling said assembly down to room temperature, placing a ring of gold-plated molybdenum wire on one of said surfaces of the crystal around the antimony pellet thereon, passing alternating current around two halves of said ring in parallel until said gold-plating flows and forms a union with said one surface of the crystal, placing the ends of two platinum wires in contact respectively with said two antimony pellets, melting said antimony pellets by the passage of alternating current between said wires, inserting the wires respectively into the melted pellets, applying a suitable flux at the junctions between the wires and the pellets and remelting said antimony pellets by the passage of alternating current between the wires until the wires are wetted by the antimony of the pellets.

References Cited in the file of this patent

UNITED STATES PATENTS

| | | |
|---|---|---|
| 2,671,156 | Douglas et al. | Mar. 2, 1954 |
| 2,701,326 | Pfann et al. | Feb. 1, 1955 |
| 2,756,483 | Wood | July 31, 1956 |
| 2,758,261 | Armstrong et al. | Aug. 7, 1956 |
| 2,796,563 | Ebers et al. | June 18, 1957 |
| 2,820,932 | Looney | Jan. 21, 1958 |

FOREIGN PATENTS

| | | |
|---|---|---|
| 697,869 | Great Britain | Sept. 30, 1953 |